United States Patent
Kastenmeier et al.

(10) Patent No.: US 8,987,862 B2
(45) Date of Patent: Mar. 24, 2015

(54) METHODS OF FORMING SEMICONDUCTOR DEVICES HAVING CONDUCTORS WITH DIFFERENT DIMENSIONS

(75) Inventors: Bernd E. Kastenmeier, Austin, TX (US); Raman E. Evazians, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 412 days.

(21) Appl. No.: 13/004,988

(22) Filed: Jan. 12, 2011

(65) Prior Publication Data
US 2012/0175733 A1  Jul. 12, 2012

(51) Int. Cl.
*H01L 27/08* (2006.01)
*H01L 23/522* (2006.01)
*H01L 21/768* (2006.01)
*H01L 23/528* (2006.01)

(52) U.S. Cl.
CPC ...... *H01L 23/5223* (2013.01); *H01L 21/76802* (2013.01); *H01L 23/5283* (2013.01); *H01L 23/5286* (2013.01); *H01L 2924/0002* (2013.01)
USPC ............. 257/532; 257/E21.008; 257/E27.048

(58) Field of Classification Search
USPC .......................... 257/532, E21.008, E27.048
See application file for complete search history.

(56) References Cited

U.S. PATENT DOCUMENTS

| | | |
|---|---|---|
| 5,583,359 A | 12/1996 | Ng et al. |
| 5,795,823 A | 8/1998 | Avanzino et al. |
| 6,385,033 B1 | 5/2002 | Javanifard et al. |
| 6,690,570 B2 | 2/2004 | Hajimiri et al. |
| 7,411,270 B2 | 8/2008 | Min et al. |
| 2011/0175233 A1* | 7/2011 | Ueki .............................. 257/774 |

* cited by examiner

*Primary Examiner* — Long Pham
(74) *Attorney, Agent, or Firm* — Daniel Hill; Sherry Schumm

(57) ABSTRACT

A device structure includes an inter-level dielectric, a via, a first conductive trench, and a second conductive trench. The inter-level dielectric has a top surface and a bottom surface. The via extends from the top surface to the bottom surface. The first conductive trench extends from the top surface to a first depth below the top surface. The second conductive trench extends from the top surface to a second depth below the top surface, wherein the second depth is above the bottom surface and below the first depth.

18 Claims, 4 Drawing Sheets

METHODS OF FORMING SEMICONDUCTOR DEVICES HAVING CONDUCTORS WITH DIFFERENT DIMENSIONS

BACKGROUND

1. Field

This disclosure relates generally to integrated circuits, and more specifically, to a semiconductor device having conductors with different dimensions, and a method for forming the device.

2. Related Art

In current damascene interconnects, a parameter used to control the physical properties of a conductor is width. The resistance of a conductor is controlled by changing the width of the conductor. However, it is not always possible to widen a conductor beyond a certain dimension to achieve the desired resistance due to processing implications (i.e., dishing) and space constraints. Also, another physical property of a conductor that is desirable to be controlled is the parasitic capacitance of conducting shapes near the conductor. In certain applications, such as capacitors, it might be desirable to increase the parasitic capacitance by changing the dimensions of the conductor.

Therefore, what is needed is a semiconductor device and method that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
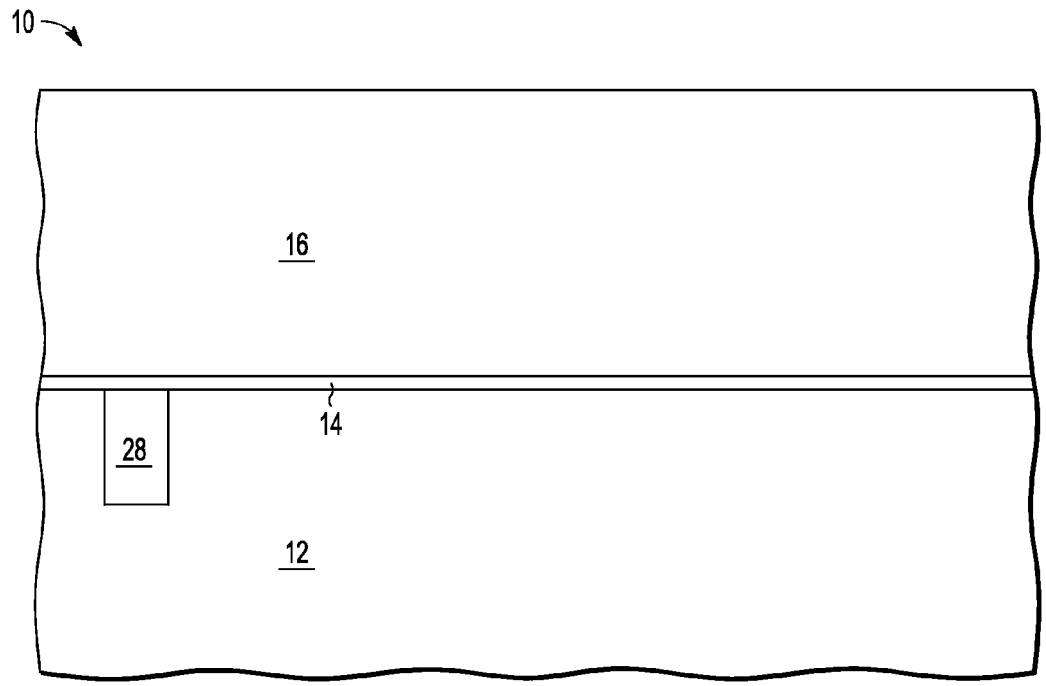
FIGS. 1 through 6 illustrate cross-sectional views of steps for making a semiconductor device in accordance with an embodiment.

Generally, there is provided, a semiconductor device having a plurality of conductors of different dimensions in an inter-level dielectric (ILD) layer. In one embodiment, one conductor has a first depth and a first width, and a second conductor has a second depth and the first width, where the second depth is substantially deeper than the first depth. In another embodiment, one conductor has the second depth and a second width, where the second width is substantially wider than the first width. A method for making the semiconductor device includes a first etching step to form shallow trenches for conductors having the first depth, and a second etching step to form deep trenches for conductors having the second depth. In another embodiment, the method for making the semiconductor device includes using a timed etch to form trenches having the second depth deeper than the first depth. In another embodiment, an etch stop layer may be provided to determine the second depth. In another embodiment, the second depth may be substantially the same as the ILD layer. Forming conductors in this way in a semiconductor device provides conductors having a larger cross-section, where desirable, without increasing the surface area of an integrated circuit. In one embodiment, the conductors are formed from metal. The conductors having the greater depth may be useful for providing a fringe capacitor or to route a power supply voltage across the integrated circuit.

In one aspect, there is provided, a device structure, comprising: an inter-level dielectric having a top surface and a bottom surface; a via extending from the top surface to the bottom surface; a first conductive trench extending from the top surface to a first depth below the top surface; and a second conductive trench extending from the top surface to a second depth below the top surface, wherein the second depth is above the bottom surface and below the first depth. The device structure may further comprise a third conductive trench extending from the top surface to the second depth below the top surface and adjacent to the second conductive trench to form a fringe capacitor between the second conductive trench and the third conductive trench. The second conductive trench may have a first width at the top surface. The device structure may further comprise a third conductive trench extending to the second depth having a second width at the top surface, wherein the second width is greater than the first width. The third conductive trench may be a power supply line. The device structure may further comprise a fourth conductive trench extending from the top surface to the second depth below the top surface and adjacent to the second conductive trench to form a fringe capacitor between the second conductive trench and the fourth conductive trench. The first conductive trench and the second conductive trench comprise copper. The device structure may further comprise a cap layer on the bottom surface. The device structure may further comprise a second inter-level dielectric layer adjoining the cap layer.

In another aspect, there is provided, a method of making a device structure in an inter-level dielectric having a top surface and a bottom surface, comprising: etching a first opening through the inter-level dielectric; etching a first trench partially through the inter-level dielectric to a first depth; etching a second trench opening partially through the inter-level dielectric to a second depth deeper than the first depth; and filling the first opening, the first trench, and the second trench with conductive material. The method may further comprise: etching a third trench adjacent to the second trench partially through the inter-level dielectric to the second depth; and filling the third trench with conductive material to form a fringe capacitor with the second trench filled with conductive material. Etching the third trench may occur while etching the second trench and filling the third trench may occur while filing the first opening, the first trench, and the second trench. The step of etching the second trench may be further characterized as etching the second trench to a first width at the top surface, the method may further comprise: etching a third trench partially through the inter-level dielectric to the second depth wherein the third trench has a second width greater than the first width at the top surface; and filling the third trench with conductive material. Etching the third trench may occur while etching the second trench and filling the third trench while filing the first opening, the first trench, and the second trench. The third trench may be filled with conductive material and function as a power supply line. The method may further comprise: etching a fourth trench adjacent to the second trench partially through the inter-level dielectric to the second depth; and filling the fourth trench with conductive material to form a fringe capacitor with the second trench filled with conductive material. The step of filling may be further characterized as filling with copper.

In yet another aspect, there is provided, a method of forming a device structure including a fringe capacitor, comprising: forming a via opening through an inter-level dielectric; forming a first trench through the inter-level dielectric to a first depth; forming a plurality of capacitor electrode trenches adjacent to each other to a second depth greater than the first depth in the inter-level dielectric; and filling the via opening, the first trench, and the plurality of capacitor electrode trenches with conductive material, wherein the step of filling the plurality of capacitor electrode trenches forms the fringe capacitor. The step of filling may comprise filling with copper. The method may further comprise: forming a third trench formed while forming the pair of capacitor electrode trenches; and filling the third trench with conductive material to form a power line in the third trench. The step of forming the pair of capacitor electrode trenches may be further characterized by the pair of capacitor electrode trenches each having a first width, the method may further comprise: forming a third trench having a second width greater than the first width formed while forming the pair of capacitor electrode trenches; and filling the third trench with conductive material while filling the via, the first trench, and the plurality of capacitor electrode trenches to form a power line in the third trench.

The semiconductor substrate described herein can be any semiconductor material or combinations of materials, such as gallium arsenide, silicon germanium, silicon-on-insulator (SOI), silicon, monocrystalline silicon, the like, and combinations of the above.

FIGS. 1 through 6 illustrate cross-sectional views of steps for making a semiconductor device in accordance with an embodiment.

FIG. 1 illustrates a cross-sectional view of semiconductor device 10 after an inter-level dielectric (ILD) layer 16 is formed over an ILD layer 12. Inter-level dielectric layers 12 and 16 may be two of many ILD layers for providing an interconnect structure for an integrated circuit. In one embodiment, ILD layer 12 may be a first interconnect layer formed over a semiconductor substrate. In another embodiment, layer 12 may be a semiconductor substrate and ILD layer 16 is formed on a semiconductor substrate. ILD layer 16 may be formed from, for example, silicon dioxide, a silicon dioxide comprising carbon, or a carbon-polymer. Generally, the ILD layers include metal conductors, vias and contacts that are connected to other metal conductors, vias, and contacts in other ILD layers and the substrate for providing electrical connects for various components, such as for example, transistors, resistors, capacitors, and the like. A representative metal conductor 28 is formed in ILD layer 12. Also, there may a dielectric cap layer 14 formed over ILD layer 12 in some embodiments. Dielectric cap layer 14 may be formed to function as an etch stop and may be formed from, for example, silicon nitride. Dielectric cap layer 14 may be formed to prevent copper oxidation and may be, for example, silicon carbide. In one embodiment, a hardmask (not shown) may be formed over ILD layer 16 to protect a top surface of ILD layer 16 during subsequent etching steps.

Figure 2:
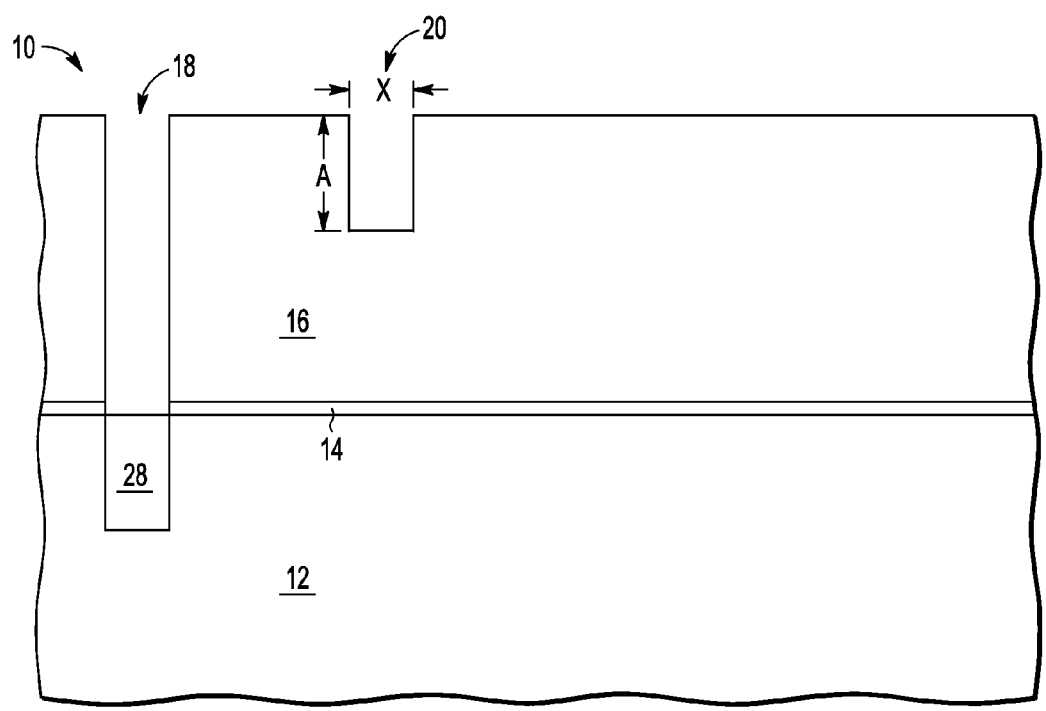

FIG. 2 illustrates a cross-sectional view of semiconductor device 10 after patterned photoresist layers (not shown) are formed on ILD layer 16. The photoresist layers are patterned to form vias and trenches in ILD layer 16. As illustrated in FIG. 2, a via opening 18 and a shallow trench opening 20 are formed in ILD layer 16 by using one or more conventional etching processes. Via opening 18 extends from a top surface of ILD layer 16, through ILD layer 16 to a bottom surface of ILD 16, and through dielectric cap layer 14 to allow electrical contact with metal conductor 28. Shallow trench 20 has a first depth labeled "A" and a first width labeled "X". Shallow trench 20 is used to form a conductive line having a cross-section substantially the same as trench 20. Note that a via opening differs from a trench opening in that the trench opening has a length, width, and depth, where the length is significantly different than the width. In the illustrated embodiment, the length of the trench projects into the cross-section. In a via opening, the length and width dimensions are substantially the same. Also, the via contacts the underlying conductor.

Figure 3:
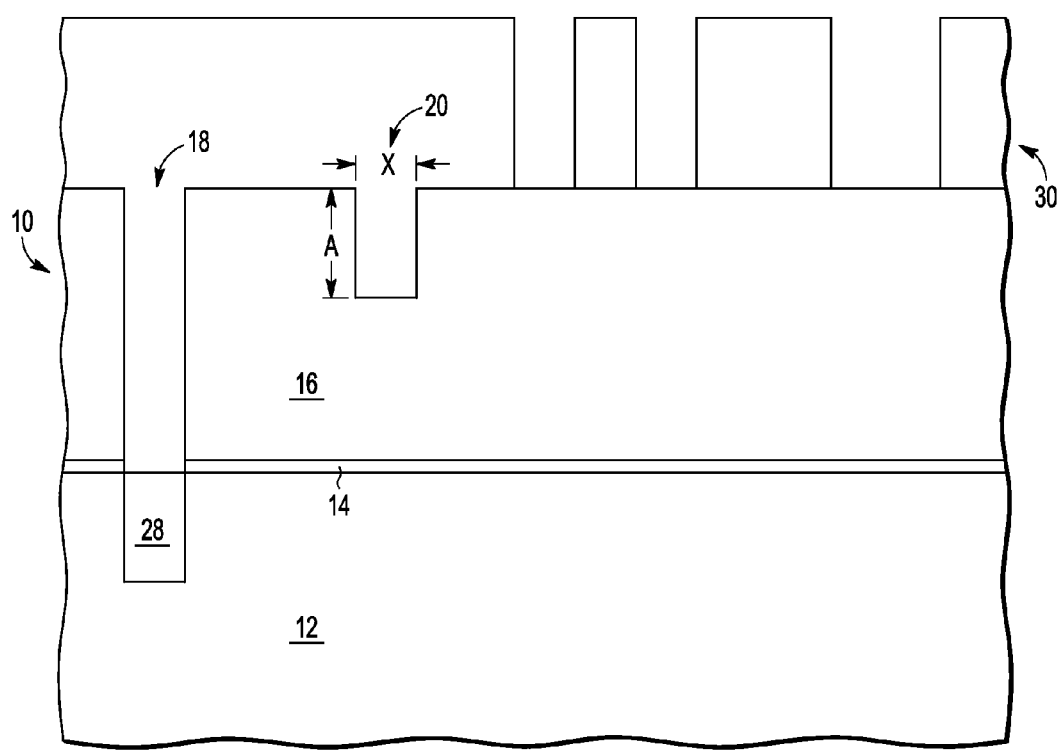

FIG. 3 illustrates a cross-sectional view of semiconductor device 10 after a patterned photoresist layer 30 is formed over ILD layer 16. Photoresist layer 30 is patterned to form two openings having a first width and another opening having a second width that is wider than the first width. Via opening 18 and trench opening 20 are protected from further etching by patterned photoresist 30. Note that even though the drawings show the trenches having a uniform width from top to bottom, the trenches may actually have a varying width, where the width at the top surface is greater than a width at the bottom surface. The extent of this variation will depend, at least in part, on the etch process used to form the trenches.

Figure 4:
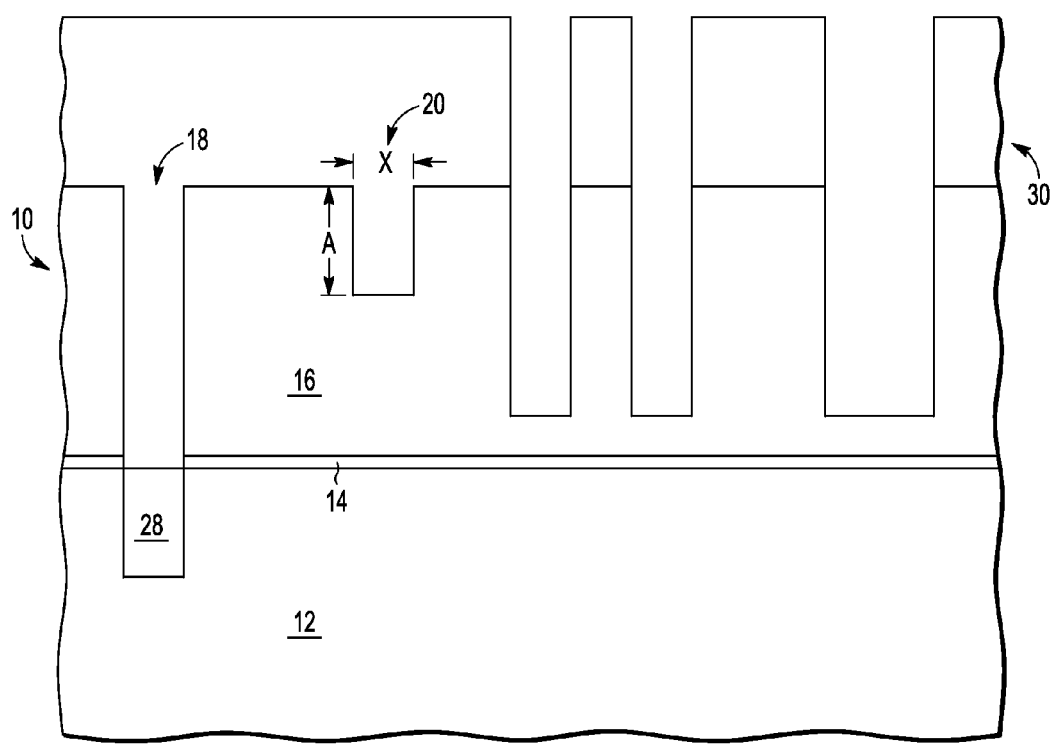

FIG. 4 illustrates a cross-sectional view of semiconductor device 10 after trenches are etched into ILD layer 16 using patterned photoresist 30. In one embodiment, the depth of the trenches may be controlled by timing the etching processing. In another embodiment, an additional etch stop layer (not shown) may be used to determine the depth of the trenches. In yet another embodiment, the depth of the trench may be the same as the depth of the ILD. ILD layer 16 is etched using a conventional semiconductor etching process. The width of the trenches is determined by the width of the openings in patterned photoresist 30.

Figure 5:
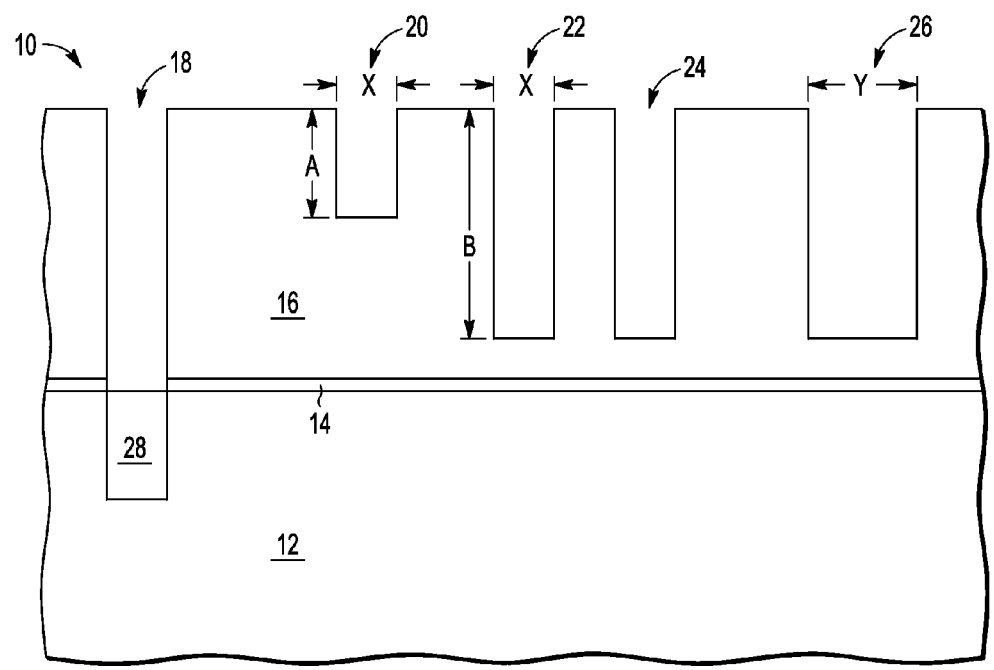

FIG. 5 illustrates a cross-sectional view of semiconductor device 10 after photoresist 30 is removed from the surface of ILD layer 16. Trenches 22, 24, and 26 have been formed in ILD layer 16. Trenches 22 and 24 have width X and a depth labeled "B", where depth B is substantially greater than depth A. Conductive lines having cross-sections substantially equal to the cross-sections of the trenches will be formed in the trenches. In one embodiment, depth B is substantially the thickness of ILD 16. In another embodiment, depth B is deeper than depth A but substantially less than the thickness of ILD 16. In yet another embodiment, depth B may vary along the length of trenches 22 and 24. The depth B may vary, for example, to avoid a capacitive coupling with an underlying component. Trench 26 has a width labeled "Y", where width Y is greater than width X.

Figure 6:
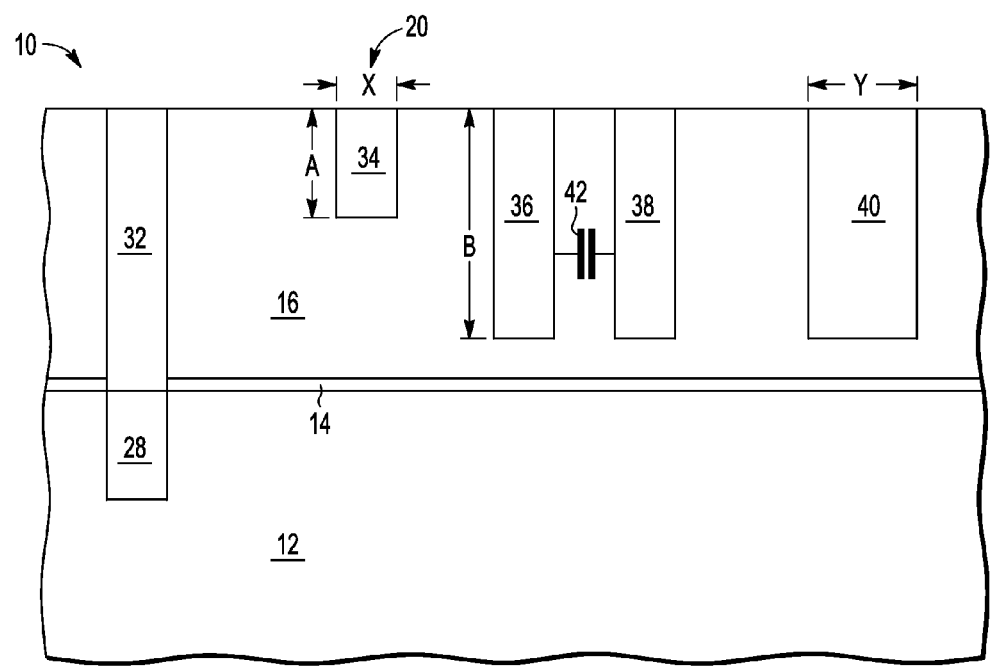

FIG. 6 illustrates a cross-sectional view of semiconductor device 10 after a metal is deposited in via opening 18 to form via 32, and in trench openings 20, 22, 24, and 26 to forming conductive lines 34, 36, 38, and 40. In one embodiment, the metal comprises copper. In another embodiment, the conductor may comprise aluminum, another metal such as tungsten, or polysilicon.

Conductive line 40 has a width Y and a depth B, where both dimensions are greater than width X and depth A. In one embodiment, conductive line 40 may be used to route a power supply voltage over an integrated circuit. Conductive lines 36 and 38 having the greater depth B and may be useful for forming fingers of a fringe capacitor, where there is a capacitance, such as a capacitance represented by capacitor 42, between adjacent fingers of the fringe capacitor. Using conductive lines having a greater depth provides a higher capacitance for a given surface area on a semiconductor die, and therefore allows the formation of a fringe capacitor that requires a smaller surface area. In one embodiment, the fringe capacitor includes a plurality of interdigitated fingers, where every odd numbered finger is coupled to a first power supply voltage terminal and every even numbered finger is coupled to a second power supply voltage terminal. Conductive lines 36 and 38 represent two such fingers in cross-section. Note that, because the conductive lines are deeper in ILD 16, they are closer to conductors in an underlying ILD, thus increasing capacitive coupling to the underlying conductors. Therefore, a fringe capacitor using multiple ILD layers would have increased capacitance to other conducting elements in the vertical direction as well as in the horizontal direction.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a device structure in an inter-level dielectric having a top surface and a bottom surface, comprising:
   etching a first opening through the inter-level dielectric;
   etching a first trench partially through the inter-level dielectric to a first depth, wherein the first trench has a first width;
   forming a patterned photoresist layer on the inter-level dielectric to protect the first trench from further etching;
   after forming the patterned photoresist layer, etching the inter-level dielectric through an opening in the patterned photoresist layer to form a second trench that extends partially through the inter-level dielectric to a second depth deeper than the first depth, wherein the second trench has a second width that is wider than the first width;
   removing the patterned photoresist layer; and
   filling the first opening, the first trench, and the second trench with conductive material.

2. The method of claim 1, further comprising:
   etching a third trench adjacent to the second trench partially through the inter-level dielectric to the second depth; and
   filling the third trench with conductive material.

3. The method of claim 2, wherein etching the third trench occurs while etching the second trench and filling the third trench occurs while filing the first opening, the first trench, and the second trench.

4. A method of making a device structure in an inter-level dielectric having a top surface and a bottom surface, comprising:
   etching a first opening through the inter-level dielectric;
   etching a first trench partially through the inter-level dielectric to a first depth;
   etching a second trench opening partially through the inter-level dielectric to a first width at the top surface and to a second depth deeper than the first depth;
   etching a third trench partially through the inter-level dielectric to the second depth wherein the third trench has a second width greater than the first width at the top surface; and
   filling the first opening, the first trench, the second trench, and the third trench with conductive material.

5. The method of claim 4, wherein etching the third trench occurs while etching the second trench and filling the third trench while filing the first opening, the first trench, and the second trench.

6. The method of claim 4, wherein the third trench is filled with conductive material functions as a power supply line.

7. The method of claim 4, further comprising:
   etching a fourth trench adjacent to the second trench partially through the inter-level dielectric to the second depth; and
   filling the fourth trench with conductive material to form a fringe capacitor with the second trench filled with conductive material.

8. The method of claim 4, wherein the step of filling is further characterized as filling with copper.

9. A method of forming a device structure including a fringe capacitor, comprising:
   forming a via opening through an inter-level dielectric;
   forming a first trench through the inter-level dielectric to a first depth;
   forming a patterned photoresist layer to protect the first trench;
   after forming the patterned photoresist layer, forming a plurality of capacitor electrode trenches adjacent to each other by etching the inter-level dielectric through a plurality of openings in the patterned photoresist layer to a second depth greater than the first depth, wherein the plurality of capacitor electrode trenches each has a first width;
   forming a second trench having a second width greater than the first width formed while forming the pair of capacitor electrode trenches;
   removing the patterned photoresist layer; and
   filling the via opening, the first trench, the second trench, and the plurality of capacitor electrode trenches with conductive material, wherein filling the plurality of capacitor electrode trenches forms the fringe capacitor, and filling the second trench forms a power line in the second trench.

10. The method of claim 9, wherein the step of filling comprises filling with copper.

11. A method of forming a semiconductor device, the method comprising:
provides an inter-level dielectric having a top surface and a bottom surface;
forming a via extending from the top surface to the bottom surface;
forming a first conductive trench having a first width and extending from the top surface to a first depth below the top surface by etching a first trench in the inter-level dielectric to the first depth, and filling the first trench with conductive material; and
forming a second conductive trench having a second width that is wider than the first width and extending from the top surface to a second depth below the top surface, wherein the second depth is above the bottom surface and below the first depth, and wherein the second conductive trench is formed by applying a patterned photoresist layer on a surface of the inter-level dielectric to protect the first trench, etching through an opening in the patterned photoresist layer to form a second trench to the second depth, and filling the second trench with the conductive material.

12. The method of claim 11, further comprising:
forming a third conductive trench extending from the top surface to the second depth below the top surface and adjacent to the second conductive trench.

13. A method of forming a semiconductor device, the method comprising:
providing an inter-level dielectric having a top surface and a bottom surface;
forming a via extending from the top surface to the bottom surface;
forming a first conductive trench extending from the top surface to a first depth below the top surface, wherein the first conductive trench has a first width at the top surface;
forming a second conductive trench extending from the top surface to a second depth below the top surface, wherein the second depth is above the bottom surface and below the first depth; and
forming a third conductive trench extending to the second depth and having a second width at the top surface, wherein the second width is greater than the first width.

14. The method of claim 13, wherein the third conductive trench is a power supply line.

15. The method of claim 14, further comprising:
forming a fourth conductive trench extending from the top surface to the second depth below the top surface and adjacent to the second conductive trench to form a fringe capacitor between the second conductive trench and the fourth conductive trench.

16. The method of claim 13, wherein the first conductive trench and the second conductive trench comprise copper.

17. The method of claim 16, further comprising:
forming a cap layer on the bottom surface.

18. The method of claim 17, further comprising:
forming a second inter-level dielectric layer adjoining the cap layer.

* * * * *